US005530674A

United States Patent [19]
McClure et al.

[11] Patent Number: 5,530,674
[45] Date of Patent: Jun. 25, 1996

[54] STRUCTURE CAPABLE OF SIMULTANEOUSLY TESTING REDUNDANT AND NON-REDUNDANT MEMORY ELEMENTS DURING STRESS TESTING OF AN INTEGRATED CIRCUIT MEMORY DEVICE

[75] Inventors: David C. McClure; Thomas A. Teel, both of Carrollton, Tex.

[73] Assignee: SGS-Thomson Microelectronics, Inc., Carrollton, Tex.

[21] Appl. No.: 235,161

[22] Filed: Apr. 29, 1994

[51] Int. Cl.$^6$ ................................................ G11C 29/00
[52] U.S. Cl. .................. 365/201; 365/200; 365/230.08; 365/230.03; 365/225.7; 365/230.06; 371/21.1
[58] Field of Search ...................... 365/201, 200, 365/225.7, 230.03, 230.06, 230.08; 371/21.1

[56] References Cited

U.S. PATENT DOCUMENTS

| | | | |
|---|---|---|---|
| 4,906,994 | 3/1990 | Hoffmann et al. | 341/51 |
| 5,113,371 | 5/1992 | Hamada | 365/200 |
| 5,204,559 | 4/1993 | Deyhimy et al. | 327/232 |
| 5,206,583 | 4/1993 | Dawson et al. | 324/158.1 |
| 5,233,566 | 8/1993 | Imamiya et al. | 365/230.08 |
| 5,247,481 | 9/1993 | Conan | 365/200 |
| 5,298,433 | 3/1994 | Furuyama | 437/8 |
| 5,299,161 | 3/1994 | Choi | 365/201 |
| 5,327,382 | 7/1994 | Seno et al. | 365/210 |
| 5,341,336 | 8/1994 | McClure | 365/201 |
| 5,404,331 | 4/1995 | McClure | 365/200 |

*Primary Examiner*—David C. Nelms
*Assistant Examiner*—Andrew Q. Tran
*Attorney, Agent, or Firm*—Renee M. Larson; Lisa K. Jorgenson; Richard K. Robinson

[57] ABSTRACT

The redundant elements of an integrated circuit memory device having a plurality of redundant and non-redundant elements such as rows, columns, wordlines, and blocks, may be selectively enabled during a stress test mode so that both redundant elements and non-redundant elements may be stress tested concurrently. Enabling capabilities contained within the redundant element circuitry selectively enables the redundant elements when a stress test signal is equal to a predetermined value, indicative of a stress test mode.

42 Claims, 3 Drawing Sheets

STRUCTURE CAPABLE OF SIMULTANEOUSLY TESTING REDUNDANT AND NON-REDUNDANT MEMORY ELEMENTS DURING STRESS TESTING OF AN INTEGRATED CIRCUIT MEMORY DEVICE

CROSS REFERENCE TO RELATED APPLICATIONS

The subject matter of the present application is related to copending U.S. application Ser. No. 08/172,854, titled "Stress Test Mode", Docket No.: 93-C-56, filed Dec. 22, 1993, and copending U.S. application Ser. No. 08/220,976, titled "Fuse Circuitry Which Can Emulate Fuse Blowing", Docket No.: 94-C-03, filed Mar. 31, 1994, both of which are assigned to the assignee hereof and are herein incorporated by reference.

BACKGROUND OF THE INVENTION

The present invention relates generally to integrated circuit memory devices, and more specifically to integrated circuit memory devices which undergo stress testing.

Stress testing of integrated circuit memory devices having redundant and non-redundant elements is a valuable technique used to analyze the reliability of the device. Stress testing enables a plurality of rows and/or columns of the memory device, and it is desirable to enable all rows and columns of the memory device simultaneously so that these elements are stressed in the most efficient manner. Enhanced stress test modes which provide substantial benefits such as decreased burn-in time, decreased FIT rate, and improved yield have been defined. For example, copending U.S. Pat. application Ser. No. 08/172,854, titled "Stress Test Mode", Docket No.: 93-C-56, filed Dec. 22, 1993, discusses some of these benefits. Such enhanced stress test modes tend to accelerate oxide failures of the device being stressed and thus create yield fallout normally not seen until burn-in of the device. Additionally, optimal device reliability may be obtained when the cells of a memory device, redundant and non-redundant, are equally subjected to stress testing.

When a memory device is stressed tested during the manufacturing flow will determine whether all cells of the device are stressed equally. If the memory device is stressed at prelaser or some other pre-repair step, the redundant elements are not yet enabled, and hence only the non-redundant elements are stressed at that time. Then, when the redundant elements are enabled at postlaser or some other post-repair step, the device would be stressed again to verify all the elements of the device have been stressed for maximum fault coverage. For example, a fast 1 Meg SRAM which has in excess of 20,000 redundant elements would need to be stress tested after the redundant elements are enabled at postlaser to ensure reliability of the redundant elements. As a result of performing two stress tests, one at prelaser and the second at postlaser, the non-redundant elements of the device are stressed twice while the redundant elements are stressed only once. From a reliability standpoint, it is undesirable to stress the redundant and non-redundant elements of the device unevenly in this manner. Also, performing multiple stress tests requires more time and is thus more costly.

One possible solution is to perform stress testing of the device only at postlaser so that stress test time is reduced and all elements of the device, redundant and non redundant, are equally stressed. However, postlaser stress testing, unlike prelaser stress testing, does not allow yield fallout recovery. Yield fallout from postlaser stress testing can be significant and may be greater than 3% of the device depending on the density, process maturity, and processing of the memory device. Thus, while only performing stress testing at postlaser repair does not unevenly stress the device, it does have a negative impact on the potential yield recovery of the device.

Thus, there exists a current need in the art to equally stress test redundant and non-redundant elements of an integrated circuit device in such a manner that yield fallout resulting from enhanced stress test modes or otherwise may be recovered, and stress testing time may be minimized.

SUMMARY OF THE INVENTION

It would be advantageous in the art to perform stress testing on redundant and non-redundant elements of an integrated circuit memory device, such that the redundant and non-redundant elements are equally stressed.

It would further be advantageous in the art to perform stress testing on redundant and non redundant elements of an integrated circuit device, such that yield fallout from such stress testing, especially yield fallout associated with enhanced stress test modes, may be recovered.

It would further be advantageous in the art to minimize the stress testing time to which an integrated circuit memory device is subjected.

Therefore, according to the present invention, the redundant elements of an integrated circuit memory device having a plurality of redundant and non-redundant elements such as rows, columns, wordlines, and blocks, may be selectively enabled during a stress test mode so that both redundant elements and non-redundant elements may be stress tested concurrently. Enabling means contained within the redundant element circuitry selectively enables the redundant elements when a stress test signal is equal to a predetermined value, indicative of a stress test mode.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention provides the means by which redundant elements of an integrated circuit memory device may be selectively enabled during a stress testing mode so that redundant and non-redundant elements alike may be stress tested concurrently and thus receive the same exposure to stress testing. Ensuring that redundant and non-redundant elements alike receive the same stress testing ensures that reliability of the device is not degraded. When the redundant and non-redundant elements of the device are tested is important as well. For example, using the current invention to perform stress testing at prelaser or some other pre-repair step will allow yield fallout associated with enhanced stress test modes to be recovered and requires that only a single stress test at pre-laser be performed, rather than multiple tests.

An integrated circuit memory device, such as a static random access memory (SRAM), contains a number of different types of redundant elements which may be desirable to submit to stress testing. These redundant elements include, but are not limited to, redundant rows (redundant wordlines), redundant columns (redundant bitlines), and redundant blocks of the memory device. FIGS. 1 to 5 illustrate circuitry for these types of redundant elements according to the present invention.

Figure 1:
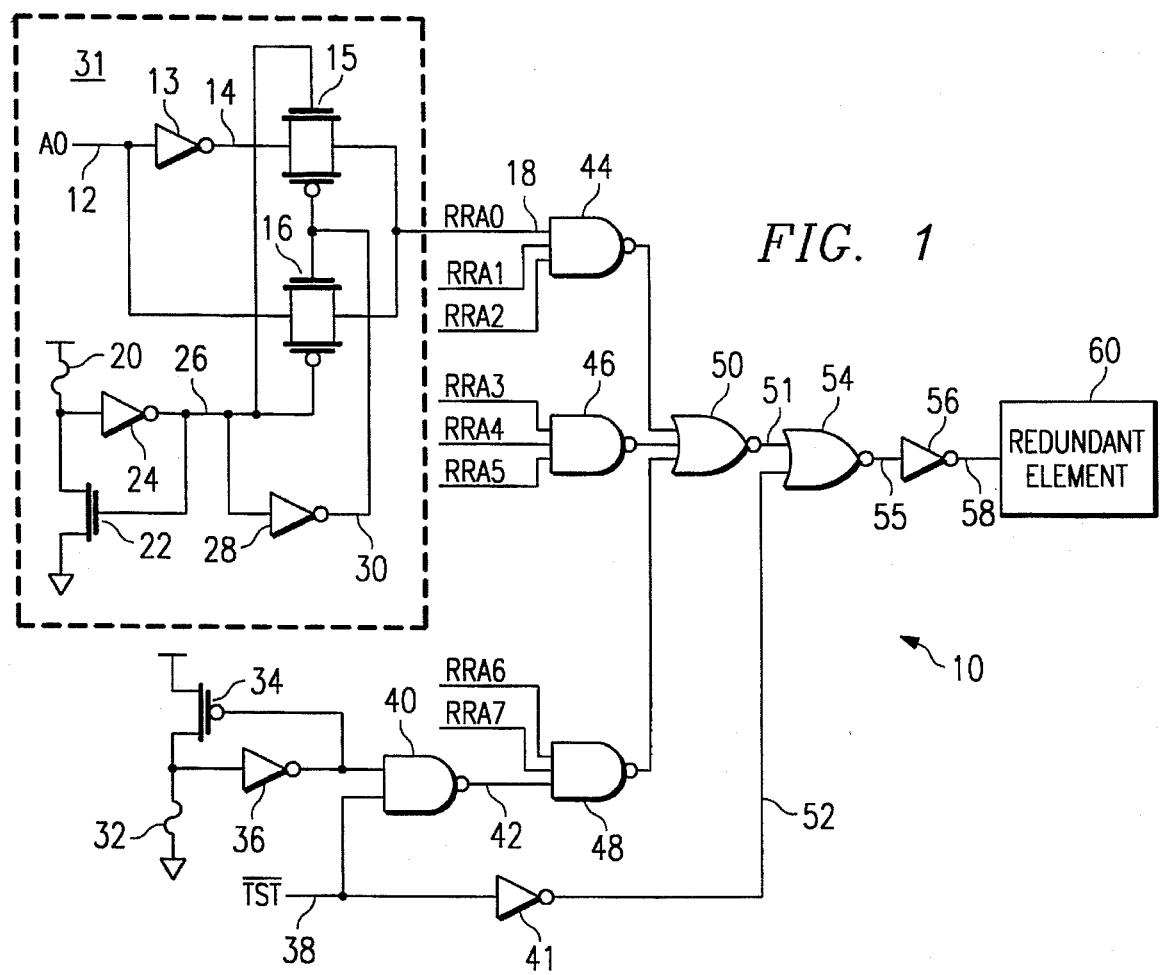
FIG. 1 is a schematic diagram of row redundancy circuitry of an integrated circuit memory, according to the present invention.

Referring to FIG. 1, row redundancy circuitry 10 for a given row address, such as might be used in a static random access memory (SRAM) device, is shown. Row redundancy circuitry 10 would be representative of such circuitry known in the art, except that stress test signal $\overline{TST}$ 38 and associated circuitry NAND gate 40 have been added to allow redundant element 60 into be selectively enabled during stress testing.

Row address A0 signal 12 is an input signal to passgate 16, and is inverted by inverter 13 to produce signal 14, the complement signal of row address A0 signal 12, which is an input signal to passgate 15, as shown. Circuitry 31 inside the dashed lines generates row redundancy address RRA0 signal 18. Fuse 20 has a first terminal connected to supply voltage VCC and a second terminal connected to a first source/drain of transistor 22 and an input terminal of inverter 24, as shown. The output terminal of inverter 24 is connected to the gate of transistor 22 and signal 26. Signal 26 and its inverse, signal 30 which is created by being inverted by inverter 28, control passgates 15 and 16. Fuse 20 is selectively blown to program whether the output signal of passgates 15 and 16, row redundancy address RRA0 signal 18, will correspond to row address A0 signal 12 or its complement, address signal 14. Row redundancy address RRA0 signal 18 is an input signal to NAND gate 44 as shown.

Circuitry 31 is duplicated for each row address signal. As shown here, circuitry 31 must be duplicated seven times in order to generate row redundancy address signals RRA1, RRA2, RRA3, RRA4, RRA5, RRA6, and RRA7, which are input signals to NAND gates 44, 46, and 48, as shown. As RRA0 is the result of circuitry 31 which performs logic on row address A0 signal 12, so are RRA1, RRA2, RRA3, RRA4, RRA5, RRA6, and RRA7 the result of duplicated circuitries which performs logic on other row address signals, analogous to row address A0 signal 12, and not shown here for simplicity.

Master fuse 32 has a first terminal which is connected to supply voltage VSS and a second terminal which is connected to a first source/drain of transistor 34 and an input terminal of inverter 36. The output terminal of inverter 36 is connected to the gate of transistor 34, whose second source/drain is connected to supply voltage VCC, and NAND gate 40. Master fuse 32 may or may not be blown and is gated by stress test $\overline{TST}$ signal 38 through NAND gate 40. During a stress test, all row address signals of the device, such as row address A0 signal 12, are forced to a high logic level, stress test $\overline{TST}$ signal 38 is brought to a low logic level and master enable signal 42 is forced to a high logic level such that blowing of master fuse 32 is simulated. Redundant global wordline signal 58 is forced to a high logic level such that redundant element 60 is enabled.

The output signals of NAND gates 44, 46, and 48 feed into NOR gate 50 which produces signal 51. Signal 51 and signal 52, the result of passing stress test $\overline{TST}$ signal 38 through inverter 41, are input signals to NOR gate 54. NOR gate 54 produces signal 55 which is fed to inverter 56 which produces redundant global wordline signal 58. The logic state of redundant global wordline signal 58, in turn, determines whether redundant element 60 will be enabled. Stress test $\overline{TST}$ signal 38 passes through inverter 41 and emerges as signal 52 to control NOR gate 54, since at postlaser or some other post-repair step, fuse 20 may or may not be blown. If fuse 20 is blown, it results in a low logic state row redundancy address RRA0 signal 18 to its associated NAND gate 44. In this way, stress test $\overline{TST}$ signal 38 may be used to force redundant global wordline signal 58 to a logic high level regardless of whether fuse 20 has or has not been blown. Master enable signal 42 allows the path through NAND gates 44, 46, 48, and NOR gate 50 to be exercised in an enabling state at pre-laser to maximize fault coverage at these nodes, even when signal 52 forces redundant global wordline signal 58 to a high logic level.

Figure 2:
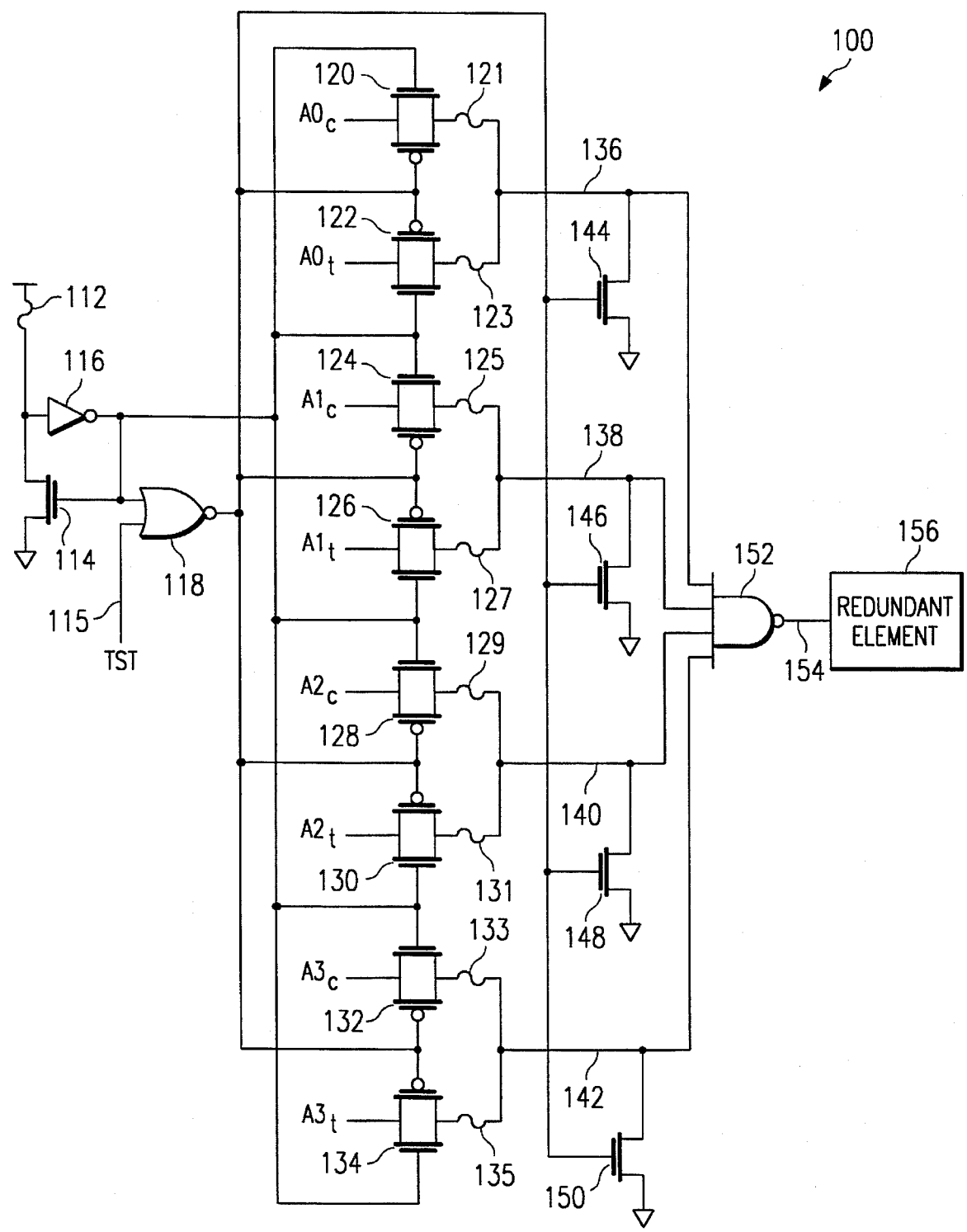
FIG. 2 is a schematic diagram of redundant column decoder circuitry, according to the present invention.

Referring to FIG. 2, redundant column decoder circuitry 100, such as might be used in a SRAM device, is shown. Fuse 112 and stress test TST signal 115 together control the enabling of redundant element 156. A first terminal of fuse 112 is connected to supply voltage VCC and a second terminal of fuse 112 is connected to an input terminal of inverter 116 and a first source/drain of transistor 114. An output terminal of inverter 116 is connected to the gate of transistor 114 as well as being the input signal to NOR gate 118, as shown. Additionally, the output signal of inverter 116 controls the n-channel transistors of passgates 120, 122, 124, 126, 128, 130, 132, and 134, and the output signal of NOR gate 118 controls the p-channel transistors of these passgates and n-channel transistors 144, 146, 148, and 150, as shown. True and complement address signals A0c, A0t, A1c, A1t, A2c, A2t, A3c, and A3t are input signals to passgates 120, 122, 124, 126, 128, 130, 132, and 134, respectively. The output signals of passgates 120 and 122 pass through fuses 121 and 123, respectively, before being connected together to form signal 136; the output signals of passgates 124 and 126 pass through fuses 125 and 127, respectively, before being connected together to form signal 138; the output signals of passgates 128 and 130 pass through fuses 129 and 1 31, respectively, before being connected together to form signal 140; the output signals of passgates 132 and 134 pass through fuses 133 and 135, respectively, before being connected together to form signal 142. Signals 136, 138, 140, and 142 are input signals to NAND gate 152.

Either fuse 122 may be blown or stress test signal TST 115 may be brought to the correct logic state to enable redundant element 156. When fuse 112 is blown, passgates 120, 122, 124, 126, 128, 130, 132, and 134 are enabled, and one of the two fuses associated with a true and complement address signal, A0c and A0t for instance, is blown. N-channel transistors 144, 146, 148, and 150 are off, allowing either the true or complement address signal, depending on which fuse of fuses 121,123, 125, 127, 129, 131,133, and 135 was blown, to propagate to NAND gate 152 such that signal 154 is produced and redundant element 156 is enabled. Conversely, when fuse 112 is not blown and is left intact, passgates 120, 122, 124, 126, 128, 130, 132, and 134 are not enabled and therefore do not pass through an address signal An. N-channel transistors 144, 146, 148, and 150 pull the input signals 136, 138, 140, and 142, respectively, of NAND gate 152 to a predetermined logic state so that it does not float and its output signal 154 is locked to a high logic level. However, the invention provides stress test TST signal 115 as an additional means for enabling redundant element 156 when fuse 112 is not blown. During a stress test, address signals A0c–A3t are forced to a high logic level and stress test TST signal 115 is forced to a high logic level during a stress test, turning on all p-channel passgates and allowing the blowing of fuse 112 to be emulated so that redundant element 156 is enabled. There is no contention between the true and complement address signals since they are all forced to a high logic level.

A stress test TST signal may also be similarly employed in conjunction with redundant block decoder circuitry in order to enable blocks of an integrated circuit memory during stress testing. According to the present invention, redundant block decoder circuitry similar to that shown in FIG. 2 may be utilized to enable redundant block elements of an integrated circuit memory. It is known in the art that both redundant and non-redundant elements may be grouped in memory blocks of the integrated circuit memory. The address signals input to passgates 120, 122, 124, 126, 128, 130, 132, and 134 would differ, however, in that they would be signals representative of various precoded block signals rather than true and complement signals. As in FIG. 2, during stress testing of the device, stress test TST signal 115 goes to a high logic level which forces all precoded block input signals of passgates 120, 122, 124, 126, 128, 130, 132, and 134 also to a high logic state, and the blowing of fuse 112 is emulated so that redundant element 156, representative of a redundant block element, is enabled. Here, potentially more than two precoded block signals may map to a given NAND gate input and fuses are blown to leave only one precoded block signal driving a particular NAND gate input under normal operating conditions.

Figure 3:
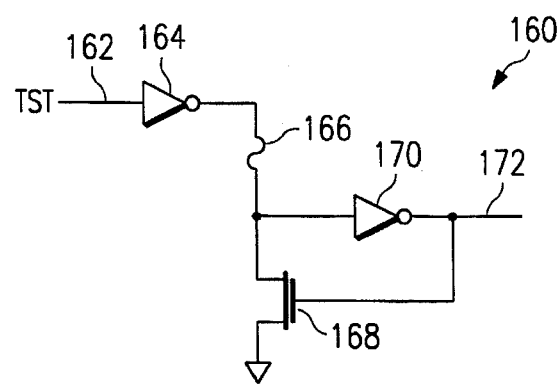
FIG. 3 is a schematic diagram of circuitry suitable for emulating the blowing of a fuse in order to enable a redundant element, according to the present invention.

Referring to FIG. 3, circuitry 160, which is suitable for emulating the blowing of a fuse in order to enable a redundant element and which may be used in conjunction with the circuitry of FIGS. 1, 2 and 3, is shown. Circuitry 160 is comprised of stress test TST signal 162, inverters 164 and 170, fuse 166, and transistor 168. Fuse 166 is connected to inverter 164 which represents a control logic means; the control logic means may be any logic gate besides the inverter 164 shown. Inverter 164 is controlled by stress test TST signal 162, the logic level of which is indicative of whether a stress test mode has been entered into.

Stress test TST signal 162 allows a signal 172 to be generated which is indicative of fuse 166 being blown, even when fuse 166 remains intact. In order to emulate blowing fuse 166, stress test TST signal 162 is brought to a high logic level. Signal 172 is a high logic level, which is the same logic level if fuse 166 had been blown, and is used to control subsequent circuitry such that a redundant element is enabled. During normal operation, stress test TST signal 162 is simply kept at a low logic level and fuse 166 may or may not be blown. Inverter 164 should be sized such that during normal operation when stress test TST signal 162 is a low logic level, fuse 166 and inverter 164 may easily overcome transistor 168, should there be any contention between fuse 166, inverter 164, and transistor 168.

Signal 172 is a high logic level, which is the same logic level if fuse 166 had been blown, and is used to control subsequent circuitry such that a redundant element is enabled. For instance, circuitry 160 could be used in place of fuse 20, transistor 22, and inverter 24 of FIG. 1; also, circuitry 160 may be used in place of fuse 32, transistor 34, inverter 36, NAND gate 40, and stress test $\overline{\text{TST}}$ signal 38 of the row redundancy circuitry 10 of FIG. 1 to control the enabling of redundant element 60, and NAND gate 40 becomes an inverter. Similarly, circuitry 160 may be used in place of fuse 112, transistor 114, inverter 116, NOR gate 118, and stress test TST signal 115 of redundant column decoder circuitry 100 of FIG. 2 to control the enabling of redundant element 156, and NOR gate 118 becomes an inverter.

Figure 4:
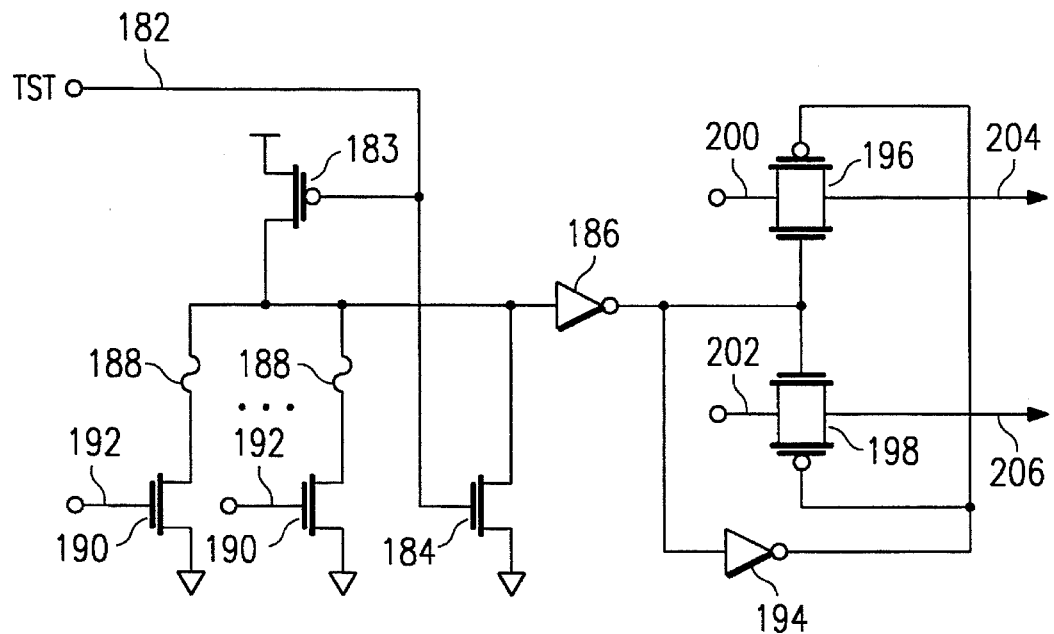
FIG. 4 is a schematic diagram of redundant data multiplexing control circuitry, according to the present invention.

Referring to FIG. 4, the present invention may also be used in conjunction with redundant data multiplexing control circuitry 180 of the type commonly used in a SRAM device. Redundant data multiplexing control circuitry 180 is similar to that known in the art, but is controlled by stress test TST signal 182 to control the enabling of redundant data elements without the need to blow fuse 188. Signal 192, representative of row/column data is fed to the gate of transistor 190. A first source/drain of transistor 190 is connected to a first terminal of fuse 188 and the second source/drain of transistor 190 is connected to supply voltage VSS, as shown. A second terminal of fuse 188 is connected to a first source/drain of transistor 183, an input terminal of inverter 186 and a first source/drain of transistor 184. The output signal of inverter 186 controls the n-channel transistors of passgates 196 and 198, while an inverse signal, represented by the output signal of inverter 194, controls the p-channel transistors of passgates 196 and 198. Data true signal 200 is the input signal of passgate 196 and data complement signal 202 is the input signal of passgate 198. Blowing or not blowing fuse 188 determines when passgate 196 will turn on, passing through redundant data true output signal 204, and when passgate 198 will turn on, passing through redundant data complement output signal 206. If fuse 188 is intact when signal 192 is a high logic level (indicative of selecting a redundant element), passgates 196 and 198 turn on, multiplexing data in/out to the redundant element. Redundant data multiplexing control circuitry 180 must be replicated an appropriate number of times, for instance eight times for an eight bit data field. Additionally, transistor 190 and fuse 188 are duplicated eight times, so that there are eight transistors 190 connected in parallel, with each transistor having a fuse 188 connected in series with it. Each input to transistor 190 is representative of a redundant column decode signal 192, which is analogous to the inverse of signal 154 of FIG. 2. This allows proper mapping of a redundant column to a particular bit in the data field.

During a stress test mode, stress test TST signal 182 is brought to a high logic level, such that the DC current path of redundant data multiplexing control circuitry 180 is eliminated since all signals 192 are equal to a high logic level because all redundant elements are selected. Stress test TST signal 182 is fed to the gate of transistor 183 and the gate of transistor 184, and thus bringing it to a high logic level emulates redundant element selection in order to enable true and complement redundant data output signals 204 or 206, respectively.

Figure 5:
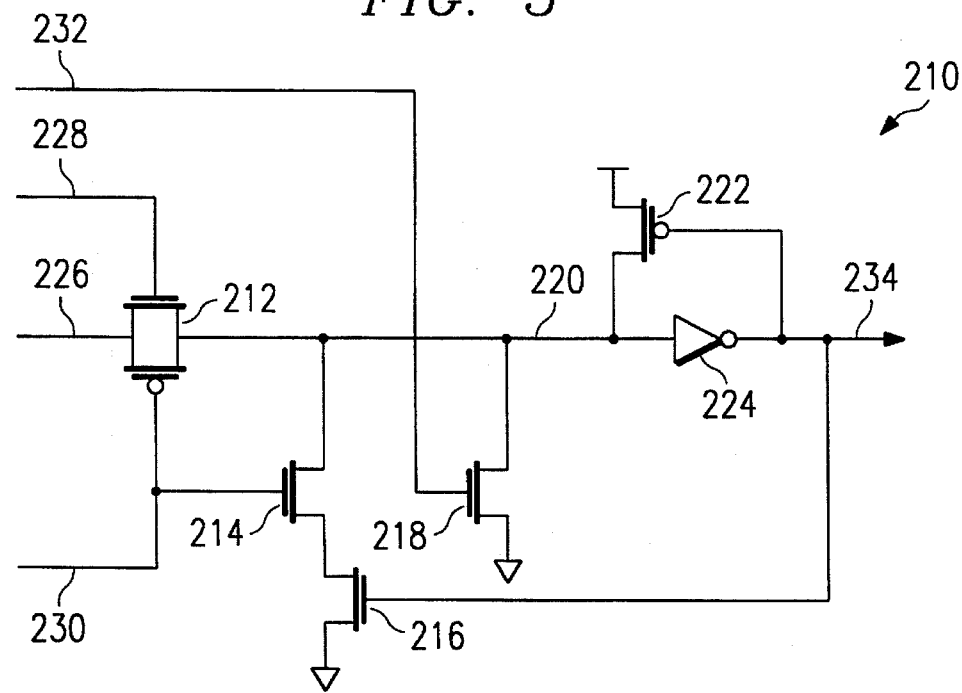
FIG. 5 is a schematic diagram of redundant global word line decoder and driver circuitry, according to the present invention.

Referring to FIG. 5, another example of redundant row circuitry similar to the output portion of circuitry 10 of FIG. 1 is shown. Redundant global wordline decoder and driver circuitry 210 has latching capabilities for synchronous normal operation such that a latchable redundant element may be placed in a latched mode during stress testing and the state of the latchable redundant element is forced to a predetermined level. Redundant global wordline decoder and driver circuitry 210 is comprised of passgate 212, transistors, 214, 216, 218, 222, inverter 224, and input signals 226, 228, 230, 232 for controlling the same, and redundant global wordline output signal 234. Redundant global word line decoder and driver circuitry 210 differs from the circuitry of FIGS. 1–4 in that there is no fuse circuitry. Instead, circuitry 210 utilizes control of passgate 212 to produce the desired logic level on redundant global wordline output signal 234.

During a stress test mode, passgate 212 is forced off by bringing signal 228 to a low logic level and signal 230 to a high logic level, and signal 232 is brought to a high logic level to force redundant global wordline output signal 234 to a high logic level. During a normal operating mode, on the other hand, signal 232 is kept at a low logic level so that control signals 228 and 230 periodically turn on passgate 212 to allow input signal 226 to pass through passgate 212. Transistors 214, 216, and 222 function to latch the state of signal 220 after it has been passed through passgate 212. Circuitry 210, must be replicated an appropriate number of times for redundant row placement.

The present invention has been illustrated in a number of redundancy circuits commonly found in integrated circuit memory devices, such as SRAMs. The present invention may be used to selectively enable redundant elements of an integrated circuit memory device so that all elements, both redundant and non-redundant, may be concurrently stress tested. Thus, the present invention allows all elements to be equally stress tested during various steps of the manufacture of an integrated circuit memory device, such as at prelaser, postlaser, or both. The present invention allows the stress test time to which a memory device is subjected to be minimized, thereby reducing testing costs. Stress testing the memory device at prelaser allows for repair of stress test yield fallout, thereby increasing the total yield of the device. Additionally, the present invention may be utilized to selectively chose which redundant elements are swapped in to replace defective non-redundant elements such that redundant element stress fallout is avoided during redundancy replacement, thereby improving the fixed-to-attempt ratio during the repair step.

While the invention has been particularly shown and described with reference to a preferred embodiment, it will be understood by those skilled in the art that various changes in form and detail may be made therein without departing from the spirit and scope of the invention.

What is claimed is:

1. An integrated circuit memory device, comprising:
   a plurality of non-redundant memory elements, arranged in a plurality of rows and a plurality of columns;
   at least one redundant memory element, suitable for replacing a non-redundant memory element that is defective; and
   enabling means, coupled to said plurality of non-redundant memory elements and said at least one redundant memory element and contained within a redundant element circuit, for selectively enabling the at least one redundant memory element when a stress test signal is equal to a first predetermined logic level indicative of a stress test mode such that the at least one redundant memory element and the plurality of non-redundant memory elements may be concurrently stress tested when the plurality of non-redundant memory elements are also enabled.

2. The device of claim 1, wherein during the stress test mode the enabling means turns on a plurality of wordlines.

3. The device of claim 2, wherein the plurality of wordlines comprises all the wordlines of the integrated circuit memory device.

4. The device of claim 1, wherein during the stress test mode the enabling means turns on a plurality of columns.

5. The device of claim 4, wherein the plurality of columns comprises all the columns of the integrated circuit memory device.

6. The device of claim 1, wherein the redundant memory element is arranged in a plurality of redundant rows.

7. The device of claim 6, wherein the enabling means is used to selectively enable the redundant rows, and the enabling means is contained within a row redundancy circuit.

8. The device of claim 7, wherein the row redundancy circuit comprises a latchable redundant element.

9. The device of claim 8, wherein the latchable redundant element is placed in a latched mode during the stress test mode, and the logic state of the latchable redundant element is forced to a second predetermined logic level.

10. The device of claim 1, wherein the redundant memory element is arranged in a plurality of redundant columns.

11. The device of claim 10, wherein the enabling means is used to selectively enable the redundant columns, and the enabling means is contained within a redundant column decoder circuit.

12. The device of claim 1, wherein the redundant memory element is grouped into at least one redundant memory array block.

13. The device of claim 12, wherein the enabling means is used to selectively enable the redundant memory array block, and the enabling means is contained within a redundant block decoder circuit.

14. The device of claim 1, wherein the plurality of non-redundant memory elements are grouped into a plurality of memory array blocks.

15. The device of claim 1, wherein the redundant memory element and the non-redundant memory elements are enabled at a pre-repair step.

16. The device of claim 15, wherein enabling the redundant memory element and the non-redundant memory elements at the pre-repair step allows recovery of stress test yield fallout at a repair step.

17. The device of claim 1, wherein the redundant memory element and the non-redundant memory elements are enabled at a post-repair step.

18. The device of claim 1, wherein the enabling means allows for selectively choosing the redundant memory element which is swapped in to replace a defective non-redundant memory element.

19. The device of claim 1, wherein the enabling means is used to control a master redundant enable element for the redundant memory element.

20. The device of claim 1, wherein the redundant memory element and the non-redundant memory elements may be stress tested concurrently.

21. The device of claim 1, wherein the integrated circuit memory device is a static random access memory (SRAM).

22. A method for enabling and stress testing one or more redundant memory elements of an integrated circuit memory device, comprising the steps of:
   selectively enabling at least one redundant memory element of the integrated circuit memory device, through an enabling means contained within a redundant element circuit, when a stress test signal is equal to a first predetermined logic level, wherein the integrated circuit memory device comprises a plurality of non-redundant memory elements and the redundant memory element, wherein the plurality of non-redundant memory elements are arranged in a plurality of rows and a plurality of columns, and the redundant memory element is suitable for replacing a non-redundant memory element that is defective; and concurrently stress testing the redundant memory element and the plurality of non-redundant memory elements when the plurality of non-redundant memory elements are also enabled.

23. The method of claim 22, wherein the redundant memory element and the non-redundant memory elements are stress tested concurrently.

24. The method of claim 22, wherein during the stress test mode the enabling means turns on a plurality of wordlines.

25. The method of claim 24, wherein the plurality of wordlines comprises all the wordlines of the integrated circuit memory device.

26. The method of claim 22, wherein during the stress test mode the enabling means turns on a plurality of columns.

27. The method of claim 26, wherein the plurality of columns comprises all the columns of the integrated circuit memory device.

28. The method of claim 22, wherein the redundant memory element is arranged in a plurality of redundant rows.

29. The method of claim 28, wherein the enabling means is used to selectively enable the redundant rows, and the enabling means is contained within a row redundancy circuit.

30. The method of claim 29, wherein the row redundancy circuit comprises a latchable redundant element.

31. The method of claim 30, wherein the latchable redundant element is placed in a latched mode during the stress test mode, and the logic state of the latchable redundant element is forced to a second predetermined logic level.

32. The method of claim 22, wherein the redundant memory element is arranged in a plurality of redundant columns.

33. The method of claim 32, wherein the enabling means is used to selectively enable the redundant columns, and the enabling means is contained within a redundant column decoder circuit.

34. The method of claim 22, wherein the redundant memory element is grouped into at least one redundant memory array block.

35. The method of claim 34, wherein the enabling means is used to selectively enable the redundant memory array block, and the enabling means is contained within a redundant block decoder circuit.

36. The method of claim 22, wherein the plurality of non-redundant memory elements are grouped into a plurality of memory array blocks.

37. The method of claim 22, wherein the redundant memory element and the non-redundant memory elements are enabled at a pre-repair step.

38. The method of claim 37, wherein enabling the redundant memory element and the non-redundant memory elements at the pre-repair step allows recovery of stress test yield fallout at a repair step.

39. The method of claim 22, wherein the redundant memory element and the non-redundant memory elements are enabled at a post-repair step.

40. The method of claim 22, wherein the enabling means allows for selectively choosing the redundant memory element which will be swapped in to replace a defective non-redundant memory element.

41. The method of claim 22, wherein the enabling means is used to control a master redundant enable element for the redundant memory element.

42. The method of claim 22, wherein the integrated circuit memory device is a static random access memory (SRAM).

* * * * *